United States Patent
Maki et al.

(10) Patent No.: US 9,373,738 B2
(45) Date of Patent: Jun. 21, 2016

(54) SOLAR MODULE

(71) Applicant: Sanyo Electric Co., Ltd., Moriguchi, Osaka (JP)

(72) Inventors: Kenichi Maki, Osaka (JP); Haruhisa Hashimoto, Minoh (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/182,506

(22) Filed: Feb. 18, 2014

(65) Prior Publication Data
US 2014/0158200 A1   Jun. 12, 2014

Related U.S. Application Data

(63) Continuation of application No. PCT/JP2011/069804, filed on Aug. 31, 2011.

(51) Int. Cl.
*H01L 31/00* (2006.01)
*H01L 31/05* (2014.01)

(52) U.S. Cl.
CPC ............ *H01L 31/0512* (2013.01); *Y02E 10/50* (2013.01)

(58) Field of Classification Search
CPC ............ H01L 31/022433; H01L 31/048; H01L 31/0481; H01L 31/05; H01L 31/0512
See application file for complete search history.

(56) References Cited

U.S. PATENT DOCUMENTS

| | | | | |
|---|---|---|---|---|
| 5,853,622 | A * | 12/1998 | Gallagher et al. | 252/512 |
| 6,099,941 | A * | 8/2000 | Wimmer | 428/192 |
| 7,804,020 | B2 | 9/2010 | Yagiura | |
| 2005/0260430 | A1 * | 11/2005 | Kuroda et al. | 428/570 |
| 2006/0231134 | A1 | 10/2006 | Yagiura | |
| 2007/0227584 | A1 * | 10/2007 | Tsunomura et al. | 136/251 |
| 2009/0044856 | A1 | 2/2009 | Yoshimine et al. | |
| 2009/0266402 | A1 * | 10/2009 | Taira | H01L 31/022433 136/244 |
| 2010/0032000 | A1 * | 2/2010 | Yoshimine | 136/244 |
| 2010/0181011 | A1 * | 7/2010 | Hashimoto et al. | 156/166 |
| 2010/0294329 | A1 | 11/2010 | Fukushima et al. | |
| 2012/0070647 | A1 * | 3/2012 | O'Neill | 428/315.5 |

FOREIGN PATENT DOCUMENTS

| | | |
|---|---|---|
| JP | 2006295087 A | 10/2006 |
| JP | 2010140984 A | 6/2010 |
| WO | 2009041506 A1 | 4/2009 |

* cited by examiner

*Primary Examiner* — Eli Mekhlin
(74) *Attorney, Agent, or Firm* — Mots Law, PLLC

(57) ABSTRACT

Provided is a solar module with improved reliability. A solar module (1) is provided with a solar cell (10), a wiring member (11), a resin adhesive layer (12), and a buffer region (40). The wiring member (11) is electrically connected to the solar cell (10). The resin adhesive layer (12) bonds the solar cell (10) and the wiring member (11) to one another. The buffer region (40) is provided at least partially between the wiring member (11) and the solar cell (10). The buffer region (40) contains a non-crosslinked resin.

4 Claims, 3 Drawing Sheets

SOLAR MODULE

CROSS-REFERENCE TO RELATED APPLICATIONS

This is a continuation of International Application PCT/JP2011/069804, with an international filing date of Aug. 31, 2011, filed by applicant, the disclosure of which is hereby incorporated by reference in its entirety.

FIELD OF THE INVENTION

The present invention relates to a solar module.

BACKGROUND

Interest in solar modules as an energy source with a low environmental impact has increased in recent years. A solar module has a plurality of solar cells connected electrically by a wiring member. In Patent Document 1, the wiring members and solar cells are bonded using a resin adhesive.

PRIOR ART DOCUMENTS

Patent Documents

Patent Document 1: Laid-Open Patent Publication No. 2010-140984.

SUMMARY

Problem Solved by the Invention

Solar cells and wiring members have different thermal expansion coefficients. The thermal expansion coefficient of the wiring members is usually greater than the thermal expansion coefficient of the solar cells. As a result, the wiring members expand more than the solar cells when the temperature of the solar module changes. As a result, stress occurs between the wiring members and the solar cells. This stress may cause the solar cells to crack or the wiring members to delaminate.

Means of Solving the Problem

The solar module of the present invention includes a solar cell, a wiring member, a resin adhesive layer, and a buffer region. The wiring member is connected electrically to the solar cell. The resin adhesive layer bonds the solar cell and the wiring member to each other. The buffer region is arranged at least partially between the wiring member and the solar cell. The buffer region includes a non-crosslinked resin.

Effect of the Invention

The present invention is able to provide a solar module with improved reliability.

DETAILED DESCRIPTION

Figure 1:
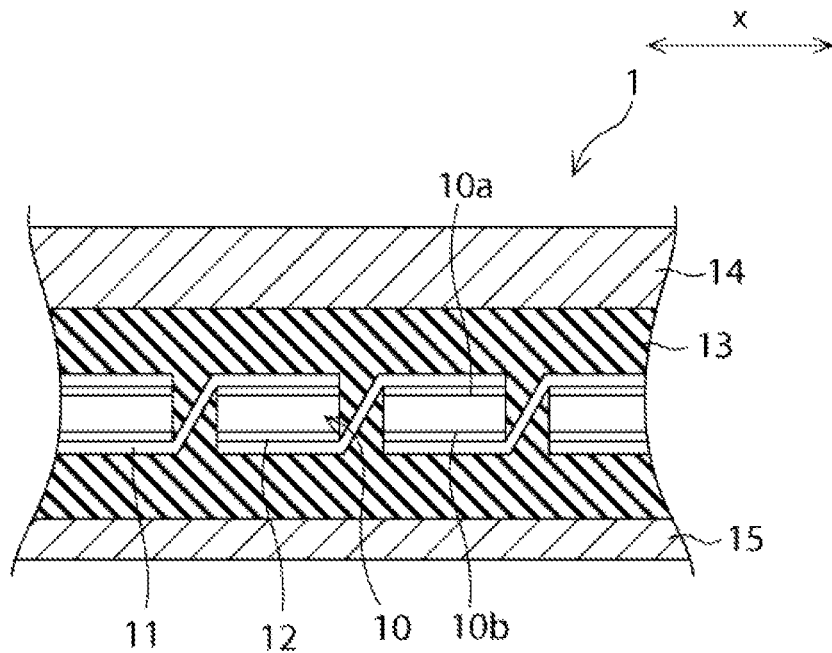
FIG. 1 is a simplified cross-sectional view of the solar module in a first embodiment.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

As shown in FIG. 1, the solar module 1 includes a plurality of solar cells 10. The solar cells 10 are connected electrically via wiring members 11. The solar cells 10 are sealed by a sealing member 13 between a first protecting member 14 and a second protecting member 15. The solar cells 10 are arranged so that the light-receiving surface 10a faces the first protecting member 14 and the back surface 10b faces the second protecting member 15. In other words, light is incident on the solar module 1 from the side with the first protecting member 14. The light-receiving surface 10a is the main surface of the solar cells 10 receiving most of the light. The solar cells 10 may generate electricity when light is incident on the light-receiving surface 10a, or the solar cells may be bifacial solar cells generating electricity when light is incident on either the light-receiving surface 10a or the back surface 10b.

The first protecting member 14 can be composed of a translucent member such as translucent glass or plastic. The second protecting member 15 can be composed of a weather-resistant member such as translucent glass or plastic, resin film, or resin film including interposed metal foil. The sealing member 13 can be composed of at least one type of resin selected from among olefin-based resins, styrene-based resins, vinyl chloride resin, ester resins, urethane-based resins, ionomers, silicone resins, acrylic resins, epoxy resins, ethylene-vinyl acetate copolymers (EVA), and polyvinyl butyral (PVB). Preferably, at least some of the sealing member 13 is composed of a non-crosslinked resin such as an olefin-based resin, styrene-based resin, or ionomer. In the following explanation, the sealing member 13 in the embodiment is composed of a non-crosslinked resin.

A terminal box may be provided on the second protecting member 15 of the solar module 1 to extract the power generated by the solar cells 10. A metal or resin frame may be provided on the peripheral edges of the solar module 1.

There are no particular restrictions on the type of solar cell 10 used in the present invention. The solar cells 10 can be composed using various types of semiconductor materials such as crystalline semiconductors and thin-film semiconductors.

Figure 2:
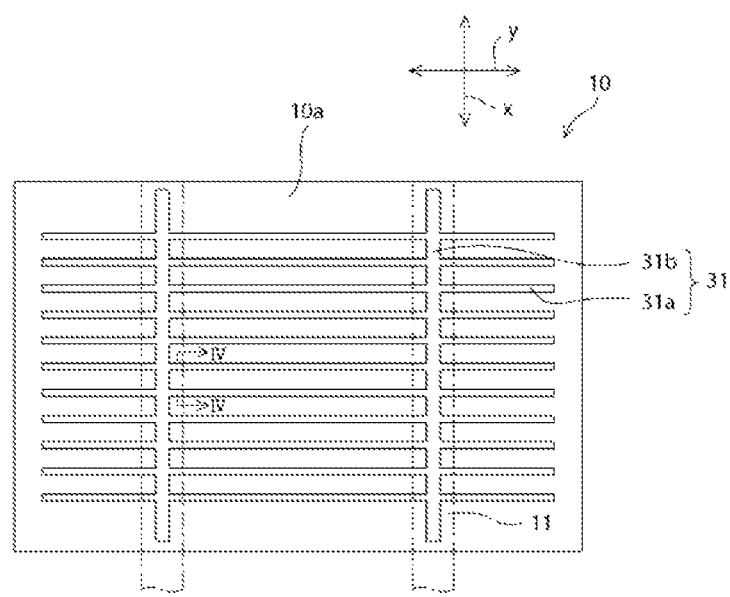
FIG. 2 is a simplified plan view of a solar cell in the first embodiment.
Figure 3:
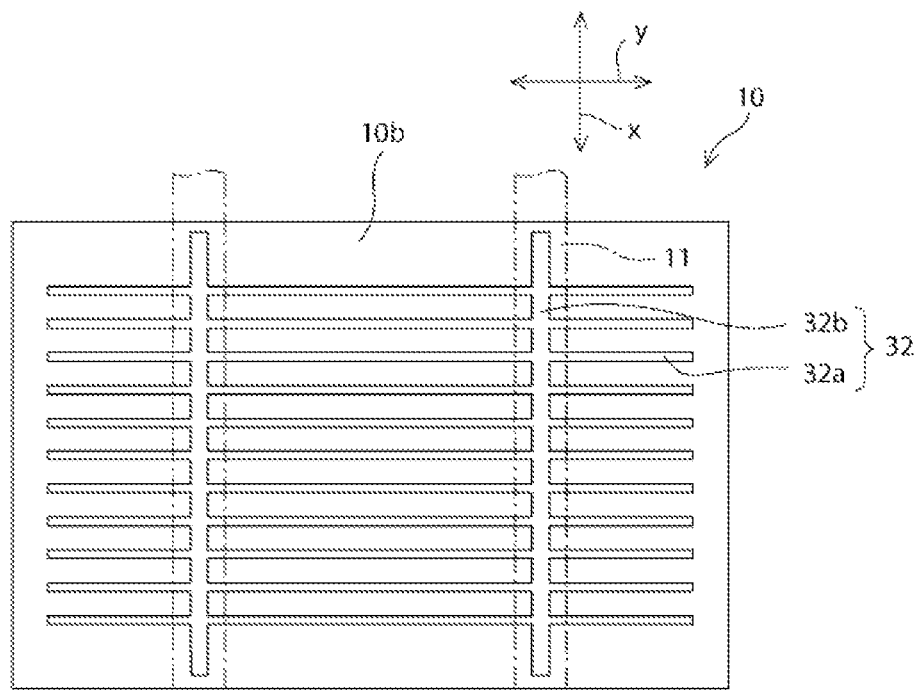
FIG. 3 is a simplified back view of a solar cell in the first embodiment.

As shown in FIG. 2 and FIG. 3, each solar cell 10 has a first electrode 31 arranged on the light-receiving surface 10a, and a second electrode 32 arranged on the back surface 10b. Either the first electrode 31 or the second electrode 32 collects holes, and the other collects electrons.

The first electrode 31 has a plurality of finger portions 31a and at least one busbar portion 31b. Each of the finger portions 31a extends in one direction (the y-direction). The finger portions 31a are interdigitated in another direction (the x-direction) intersecting the one direction (the y-direction). The finger portions 31a are connected electrically to the busbar portion 31b. The busbar portion 31b extends in the x-direction. There are no particular restrictions on the shape of the busbar portion 31b. The busbar portion 31b may have a linear shape or another shape such as a zigzag shape.

The second electrode 32 has a plurality of finger portions 32a and at least one busbar portion 32b. Each of the finger portions 32a extends in the y-direction. The finger portions 32a are interdigitated in the x-direction. The finger portions 32a are connected electrically to the busbar portion 32b. The busbar portion 32b extends in the x-direction. There are no particular restrictions on the shape of the busbar portion 32b. The busbar portion 32b may have a linear shape or another shape such as a zigzag shape.

The first electrode 31 and the second electrode 32 can be made of a suitably conductive material. More specifically, the first electrode 31 and the second electrode 32 can be made of a metal such as Ag, Cu, Au, Pt or Sn, or an alloy containing at least one of these metals. The first and second electrodes 31, 32 may also be composed of a laminate with more than one conductive layer. The first electrode 31 arranged on the light-receiving surface 10a preferably has a smaller surface area than the second electrode 32 in order to reduce light-blocking loss.

Solar cells 10 adjacent to each other in the x-direction are connected electrically via a wiring member 11. More specifically, the first electrode 31 of one of the adjacent solar cells 10 is connected electrically to one side of the wiring member 11, and the second electrode 32 of the other adjacent solar cell 10 is connected electrically to the other side of the wiring member.

The wiring member 11 can be composed of metal foil containing at least one type of metal among Ag, Cu, Au, Pt and Sn. The metal foil may be coated with a coating layer such as a solder coating layer. The width of the wiring member 11 is greater than that of the busbar portions 31b, 32b. The wiring member 11 is arranged near busbar portion 31b so as to be positioned on the light-receiving surface 10a exposed between adjacent finger portions 31a. The wiring member 11 is also arranged near busbar portion 32b so as to be positioned on the light-receiving surface 10b exposed between adjacent finger portions 32a.

Figure 4:
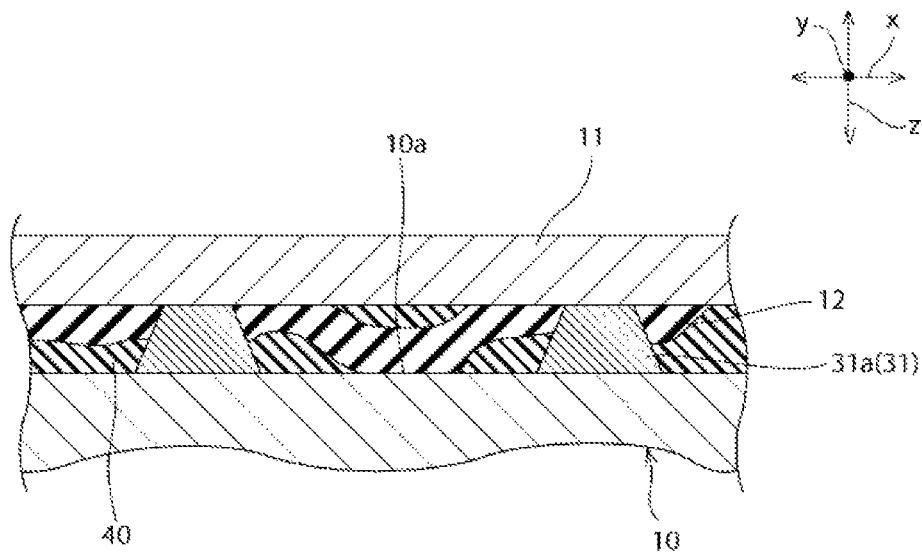
FIG. 4 is a simplified cross-sectional view from line IV-IV in FIG. 2.

As shown in FIG. 4, the wiring member 11 and the solar cells 10 are bonded via a resin adhesive layer 12. The resin adhesive layer 12 contains cured resin adhesive. The resin adhesive layer 12 may be composed exclusively of cured resin adhesive. In this case, the wiring member 11 and the solar cells 10 are bonded so that the wiring member 11 is in direct contact with the electrodes 31, 32. The resin adhesive layer 12 may contain a cured resin adhesive and a conductive material. In this case, the wiring member 11 does not have to come into direct contact with the electrodes 31, 32. The wiring member 11 and the electrodes 31, 32 may be connected electrically via the conductive material.

The resin adhesive may be a curable resin adhesive such as a thermosetting resin. Preferred examples of resin adhesives that may be used include acrylic resins, epoxy resins and urethane resins.

A buffer region 40 is arranged at least partially between the wiring member 11 and the solar cells 10. More specifically, there is a portion between the wiring member 11 and the solar cells 10 where a resin adhesive layer 12 is not provided, and the buffer region 40 is arranged in at least some of the region in which the resin adhesive layer 12 is not provided. The buffer region 40 includes a portion interposed between the resin adhesive layer 12 and the solar cells 10 and/or a portion interposed between the resin adhesive layer 12 and the wiring member 11. In the example shown in FIG. 4, the buffer region 40 includes both the portion interposed between the resin adhesive layer 12 and the solar cells 10 and the portion interposed between the resin adhesive layer 12 and the wiring member 11.

The buffer region 40 includes a non-crosslinked resin. Preferred examples of non-crosslinked resins that can be used as a constituent material of the buffer region 40 include olefin-based resins, styrene-based resins, vinyl chloride resins, ester resins, urethane-based resins, and ionomers.

The buffer region 40 is preferably composed of the same material as the sealing member 13, and is provided so as to be continuous with the sealing member 13. In other words, the buffer region 40 is preferably created when some of the material from the sealing member 13 wraps around the wiring member 11 and the solar cells 10. A solar module 1 with this configuration can be manufactured in the following ways. Anisotropically conductive film that is thinner than the height of the electrodes 31, 32 is used, or anisotropically conductive paste is applied to a thickness that is less than the height of the electrodes 31, 32 to bond the solar cells 10 to the wiring member 11. In this way, a space is formed between the solar cells 10 and the wiring member 11. Afterwards, when the solar cells 10 bonded to the wiring member 11 are arranged between the resin sheets constituting the sealing member 13 and laminated to form the sealing member 13, the lamination process is performed under conditions that allow some of the resin sheet to enter the space between the solar cells 10 and the wiring member 11. In this way, a buffer region 40 can be easily provided.

In the present embodiment, as explained above, the buffer region 40 is arranged at least partially between the wiring member 11 and the solar cells 10. Because the buffer region 40 contains a non-crosslinked resin, it has high elasticity. At high temperature, the buffer region 40 becomes soft and less rigid. Therefore, when the temperature of the solar module 1 changes, the stress applied to the solar cells 10 is reduced by the buffer region 40. As a result, cracking of the solar cells 10 and warping of the solar cells 10 can be inhibited. It also can inhibit delamination of the wiring member 11 from the solar cells 10. As a result, a solar module 1 with improved reliability can be realized. The buffer region 40 does not have to be made exclusively of a non-crosslinked resin, but should at least include a non-crosslinked resin.

From the standpoint of reducing at least some of the stress applied to the solar cells 10 when the temperature of the solar module 1 changes, the buffer region 40 preferably includes either the portion interposed between the resin adhesive layer 12 and the solar cells 10 or the portion interposed between the resin adhesive layer 12 and the wiring member 11, or preferably includes both.

In order to reduce some of the stress applied to the solar cells 10 when the temperature of the solar module 1 changes, a resin adhesive layer 12 made of a non-crosslinked resin has been considered. However, when the temperature of the solar module 1 rises, the resin adhesive layer 12 becomes soft. As a result, the wiring member 11 is more likely to peel off the solar cells 10. Therefore, the resin adhesive layer 12 is preferably a cured resin adhesive, and the buffer region 40 containing the non-crosslinked resin is preferably provided separately from the resin adhesive layer 12.

The buffer region 40 can be provided easily by providing a sealing member 13 continuous with the buffer region 40. This makes the solar module 1 easier to manufacture.

The following is an explanation of another example of a preferred embodiment of the present invention. In the following explanation, members having functions that are substantially similar to those in the first embodiment are denoted by the same reference numbers and further explanation of these members has been omitted.

2nd Embodiment

Figure 5:
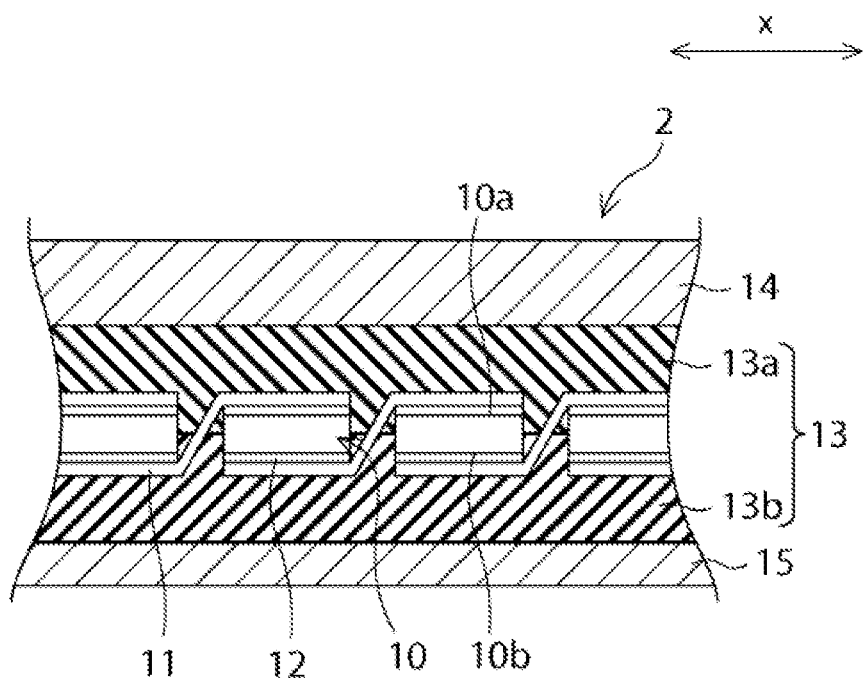
FIG. 5 is a simplified cross-sectional view of the solar module in a second embodiment.

In the explanation of the example of the first embodiment, a sealing member 13 is arranged between a first protecting member 14 and a second protecting member 15. However, in the second embodiment, as shown in FIG. 5, the sealing member 13 of the solar module 2 has a first sealing portion 13a and a second sealing portion 13b. The first sealing portion 13a is arranged between the light-receiving surface 10a of the solar cell 10 and the first protecting member 14. The second sealing portion 13b is arranged between the back surface 10b of the solar cell 10 and the second protecting member 15.

The first sealing portion 13a and the second sealing portion 13b are composed of different materials. More specifically, the first sealing portion 13a is composed of a non-crosslinked resin. Even more specifically, the first sealing portion 13a is composed of at least one type of resin selected from a group including olefin-based resins, styrene-based resins, vinyl chloride resin, ester-based resins, urethane-based resins, and ionomers.

The second sealing portion 13b is composed of a resin having a crosslinked structure. More specifically, the second sealing portion 13b can be composed of an ethylene-vinyl acetate (EVA) copolymer or an epoxy resin with a crosslinked structure.

The portion between the wiring member 11 and the light-receiving surface 10a has a buffer region 40 containing a non-crosslinked resin (see FIG. 4).

In the explanation of solar module 1, a buffer region 40 containing a non-crosslinked resin was provided at least partially between the light-receiving surface 10a and the wiring member 11, and at least partially between the back surface 10b and the wiring member 11. In solar module 2 of the second embodiment, the buffer region 40 is provided at least partially between the light-receiving surface 10a and the wiring member 11. Meanwhile, a buffer region 40 containing a non-crosslinked resin is not provided between the back surface 10b and the wiring member 11. The back surface 10b and the wiring member 11 are bonded via a resin adhesive layer 12, and the resin with a crosslinked structure constituting the second sealing portion 13b is at least partially present. Also, the buffer region 40 including the same material as the first sealing portion 13a is provided so as to be continuous with the first sealing portion 13a.

In solar module 2, the buffer resin 40 may be arranged at least partially between the light-receiving surface 10a and the wiring member 11 and at least partially between the back surface 10b and the wiring member 11. Preferably, however, the buffer region 40 is arranged on the side with the light-receiving surface 10a. This is because the portion of the wiring member 11 on the light-receiving side 10a is usually subjected to higher temperatures once installed.

The present invention includes many other embodiments not described herein. For example, the buffer region and the sealing member may be composed of different materials.

The busbar portion of the first and/or second electrode may be provided with a zigzag shape. The first and second electrodes may be busbarless electrodes composed of a plurality of finger portions and no busbar portion.

In the solar module 2 of the second embodiment, the second sealing portion 13b preferably has light-reflecting properties. This can increase the output of the solar module. An example of one of these second sealing portions 13b is one made of EVA containing titanium oxide.

The present invention includes many other embodiments not described herein. Therefore, the technical scope of the present invention is defined solely by the items of the invention specified in the claims pertinent to the above explanation.

KEY TO THE DRAWINGS 1, 2: Solar module
10: Solar cell
10a: Light-receiving surface
10b: Back surface
11: Wiring member
12: Resin adhesive layer
13: Sealing member
13a: 1st sealing portion
13b: 2nd sealing portion
14: 1st protecting member
15: 2nd protecting member
31: 1st electrode
32: 2nd electrode
31a, 32a: Finger portion
31b, 32b: Busbar portion
40: Buffer region

What is claimed is:

1. A solar module comprising:
a solar cell of a plurality of solar cells that includes a photoelectric conversion unit and an electrode formed on a surface of the photoelectric conversion unit;
the electrode comprising a bus bar along a longitudinal direction of a wiring member that electrically connects the solar cell to another solar cell of the plurality of solar cells, and a plurality of finger electrodes crossing the bus bar and integrally formed with the bus bar;
the wiring member being connected electrically to the solar cell;
a thermosetting resin adhesive layer connecting the solar cell to the wiring member arranged in a region surrounded by a back surface of the wiring member, a top of a solar cell, a side surface of the bus bar, and a side surface of a finger electrode;
a sealing member made of a non-crosslinked resin for sealing the solar cell; and
an insulating buffer region containing a non-crosslinked resin that becomes less rigid at a high temperature and that is surrounded by the back surface of the wiring member, the top surface of the solar cell, the side surface of the bus bar and the side surface of the finger electrode, the insulating buffer region and the sealing member including a common non-crosslinked resin.

2. The solar module according to claim 1, wherein the insulating buffer region is interposed between the thermosetting resin adhesive layer and at least one solar cell of the plurality of solar cells and the wiring member.

3. The solar module according to claim 1, wherein the thermosetting resin adhesive layer contains a cured resin adhesive.

4. The solar module according to claim 1, wherein the insulating buffer region is made of at least one type of non-crosslinked resin selected from a group including olefin-based resins, styrene-based resins, vinyl chloride resins, ester resins, urethane-based resins, and ionomers.

* * * * *